United States Patent
Gräβlin et al.

(10) Patent No.: US 7,183,770 B2
(45) Date of Patent: Feb. 27, 2007

(54) HIGH-FREQUENCY SYSTEM FOR AN MR APPARATUS WITH MULTIPLE TRANSMIT CHANNELS

(75) Inventors: Ingmar Gräβlin, Bönningstedt (DE); Christoph Günther Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/541,449

(22) PCT Filed: Dec. 18, 2003

(86) PCT No.: PCT/IB03/06160

§ 371 (c)(1),
(2), (4) Date: Jul. 6, 2005

(87) PCT Pub. No.: WO2004/061469

PCT Pub. Date: Jul. 22, 2004

(65) Prior Publication Data

US 2006/0054810 A1     Mar. 16, 2006

(30) Foreign Application Priority Data

Jan. 7, 2003    (EP) ................................ 03100012

(51) Int. Cl.
*G01V 3/00* (2006.01)

(52) U.S. Cl. ..................... 324/322; 324/318
(58) Field of Classification Search ............. 324/318, 324/322
See application file for complete search history.

(56) References Cited

U.S. PATENT DOCUMENTS 5,179,332 A * 1/1993 Kang ................. 324/313

(Continued)

FOREIGN PATENT DOCUMENTS

WO    WO 99/27381 A2    6/1999
WO    WO 02/095435 A1   11/2002

OTHER PUBLICATIONS

Boskamp, E.B., et al.; Whole Body LPSA transceive array with optimized transmit homogeneity; 2002; Proc. Intl. Mag. Reson. Med.; 10; p. 903.

(Continued)

*Primary Examiner*—Brij Shrivastav
*Assistant Examiner*—Megann E Vaughn
(74) *Attorney, Agent, or Firm*—Fay Sharpe Fagan Minnich & McKee LLP

(57) ABSTRACT

The invention relates to a high-frequency system for an MR apparatus with a high-frequency coil arrangement comprising a plurality of resonator elements (104), which is connected to a transmit unit (106), where a respective transmit channel (1–8) of the transmit unit (106) is assigned to the resonator elements (104). In order to provide a high-frequency system of this kind at low cost, by means of which a high frequency field can be generated in an examination volume (100) with a field distribution that can be preselected flexibly and variably, the invention proposes that the transmit unit (106) is equipped with a plurality of high-frequency amplifiers (107), the inputs of which can receive low-power transmit signals via a first controllable multiplexer/distributor network (108), in which the output signals of the high-frequency amplifiers (107) can be distributed over the transmit channels (1–8) via a second controllable multiplexer/distributor network (109). In addition, the invention relates to an MR apparatus with a high-frequency system of this kind.

19 Claims, 1 Drawing Sheet

U.S. PATENT DOCUMENTS

| | | | |
|---|---|---|---|
| 6,100,694 A * | 8/2000 | Wong | 324/318 |
| 6,236,206 B1 * | 5/2001 | Hartman et al. | 324/318 |
| 6,252,461 B1 | 6/2001 | Raab | |
| 6,252,871 B1 * | 6/2001 | Posner et al. | 370/360 |
| 6,411,090 B1 * | 6/2002 | Boskamp | 324/318 |
| 6,549,799 B2 * | 4/2003 | Bock et al. | 600/422 |
| 6,624,633 B1 * | 9/2003 | Zou et al. | 324/318 |
| 6,714,013 B2 * | 3/2004 | Misic | 324/318 |
| 6,870,368 B2 * | 3/2005 | Visser et al. | 324/318 |
| 6,906,518 B2 * | 6/2005 | Leussler | 324/318 |
| 6,989,673 B2 * | 1/2006 | Zhu | 324/318 |
| 2001/0049269 A1 | 12/2001 | Weiss | |

OTHER PUBLICATIONS

Peters, D.C., et al.; Active Guidewire Tracking with Real-Time Undersampled Projection Reconstruction; 2002; Proc. Intl. Mag. Reson. Med.; 10; p. 2271.

* cited by examiner

HIGH-FREQUENCY SYSTEM FOR AN MR APPARATUS WITH MULTIPLE TRANSMIT CHANNELS

BACKGROUND

The invention relates to a high-frequency system for an MR apparatus with a high-frequency coil configuration comprising a plurality of resonator elements, which coil arrangement is connected to a transmit unit, where a respective transmit channel of the transmit unit is assigned to the resonator elements.

The invention further relates to an MR apparatus with a high-frequency system of this kind.

In respect of the MR image generation, the localization of the nuclear magnetization takes place within the examination volume by means of time-variable, spatially-inhomogeneous magnetic fields (magnetic field gradients). To generate the image, the MR signal is recorded in the time domain as a voltage, which is induced under the influence of a suitable sequence of high-frequency pulses and gradient pulses, in the high-frequency coil arrangement enclosing the examination volume. The actual image reconstruction then takes place by Fourier transform of the time signals.

Part of the high-frequency system of the usual MR apparatuses is a transmit and receive coil, such as an integrated body coil, which is usable for the volume image generation. Separate surface coils or so-called phased-array coils may also be used in order to achieve an improvement in receive signal quality (improved signal-to-noise ratio, higher resolution). The body coils used both for excitation and for detection of MR signals are normally so-called birdcage coils. These comprise a plurality of conductor bars arranged around the examination volume and running parallel with the main field direction, which conductor bars are joined together via circulator conductors on the end faces of the coil. The resonance characteristic of body coils of this kind is determined by capacitor elements, by means of which the conductor elements are connected to a network.

The parallel use of a plurality of surface coils for receiving the MR signals from the examination volume is known from e.g. U.S. Pat. No. 6,323,648. In accordance with this document, a plurality of surface coils, arranged, in particular, in the area of the extremities of the patient under examination may be operated in parallel in order thereby to combine the MR signals detected to form an overall image. The advantage of this is that, owing to the restricted spatial sensitivity range of the surface coils, a large signal-to-noise ratio arises. The combination of surface coils for image generation is also known by the designation of SYNERGY.

Very recently, the move has been towards using high-frequency coil arrangements with a plurality of resonator elements, which are connected to the transmit unit of the MR apparatus, for the transmit mode also, wherein a transmit channel of the transmit unit is assigned to each of the individual resonator elements.

As a result of a separate transmit channel being assigned to each resonator element of the high-frequency coil arrangement in MR apparatuses of this kind, the field distribution in the examination volume is, advantageously, completely controllable. It is hereby possible to generate any conceivable current distribution in the high-frequency coil arrangement by the individual preselection of amplitude and phase on the individual transmit channels. The time characteristic of the HF feed may also be individually preselected differently on each transmit channel. The opportunity thereby exists e.g. of simulating the field distribution of a conventional birdcage coil in any resonance mode. The amplitude and the phase of each individual transmit channel may hereby be controlled by the software of the MR apparatus, which makes a direct, interactive control of the field distribution (RF shimming) possible. It is, for example, also conceivable to integrate a fully-automatic loop control of the HF field homogeneity into the image-generation sequence in order to compensate for variable influences on the field distribution, such as those from the different dielectric properties of the patient under examination.

If available, surface coils to which separate transmit channels are again assigned may also be part of the high-frequency coil arrangement of the high-frequency system in accordance with the invention, so that the surface coils may also be used in transmit mode for the variable generation of the high-frequency field in the examination volume.

A number of interesting application fields are opened up as a result of the opportunity presented by high-frequency systems of this kind to preselect as desired the spatial distribution of the high-frequency field in the examination volume. So, for example, gradients may be generated in the high-frequency field in different directions in space. As a result of the preselection of spatially-variable and time-variable high-frequency field patterns, a local coding which may be used for a rapid image generation is impressed on the nuclear magnetization distribution thereby excited (this is known as the Transmit-SENSE method). Also conceivable is a spatially selective pre-saturation of the nuclear magnetization in the examination volume.

The problem is that, with conventional MR apparatuses, the use of a high-frequency system of the type outlined above is possible only with a great deal of complexity. In principle, the plurality of transmit channels makes a corresponding number of high-frequency power amplifiers necessary. The transmit units of conventional MR apparatuses are normally equipped with a multi-stage high-frequency power amplifier (transmitting amplifier), which has only one channel, although it is capable of making high-frequency outputs available in the range of several kW. The use of a plurality of transmitting amplifiers of this kind to supply a corresponding number of transmit channels would, disadvantageously, be extremely cost-intensive, since the kW transmitting amplifiers used in MR apparatuses are extremely costly components. On the other hand, it would not be expedient to use instead a plurality of low-power transmitting amplifiers since, as a result, the flexibility and variability in the generation of the high-frequency field in the examination volume, obtained as a result of the multi-channel design of the high-frequency system, would be severely restricted. It is true that the power of a few kW, which, as mentioned above, can readily be provided by conventional MR transmitting amplifiers, is also adequate overall for high-frequency systems with a plurality of transmit channels. However, the problem is that it has to be possible, depending on the application, either to distribute the total power uniformly over all resonator elements of the high-frequency coil arrangement, or to supply the total power via a single transmit channel to only one of the resonator elements.

SUMMARY

On this basis, it is an object of the present invention to provide a cost-effective high-frequency system for an MR apparatus, the transmit unit of which is capable of supplying a plurality of transmit channels with high-frequency transmit signals in the most flexible and variable manner possible.

Starting from a high-frequency system of the type specified above, this object is achieved in that the transmit unit is equipped with a plurality of high-frequency amplifiers, the inputs of which can receive low-power transmit signals via a first controllable multiplexer/distributor network, in which the output signals of the high-frequency amplifiers can be distributed over the transmit channels via a second controllable multiplexer/distributor network.

In the high-frequency system in accordance with the invention, the individual high-frequency amplifiers are connected in parallel via the two multiplexer/distributor networks. The input signals of the transmit unit may be distributed as desired over the high-frequency amplifiers by means of the first multiplexer/distributor network. It is then possible, e.g. to supply just one of the input signals simultaneously to all of the parallel-connected high-frequency amplifiers, or to at least several of them. In accordance with the invention, the output signals of the high-frequency amplifiers are distributed over the transmit channels via the second multiplexer/distributor network. It is thus possible to add up all the output signals of the high-frequency amplifiers in order thereby to supply only a few of the transmit channels or even just one single transmit channel with increased or maximum transmit power. Equally, it is possible to distribute the output signal of each individual high-frequency amplifier uniformly over all the transmit channels. The high-frequency system in accordance with the invention thereby ensures the maximum flexibility and variability in the generation of the high-frequency field in the examination volume.

In a similar way to the conventional MR transmitting amplifiers, the transmit unit of the high-frequency system in accordance with the invention is, as mentioned, equipped with a plurality of parallel-connected high-frequency amplifiers. The sum of the individual outputs of the high-frequency amplifiers thereby corresponds to the overall transmit power of the transmit unit. The technical complexity of the high-frequency system in accordance with the invention thereby scarcely differs from that of conventional MR apparatuses. The invention therefore makes the operation of an MR apparatus with a plurality of transmit channels possible without a significantly higher cost implication for the transmit unit as compared with conventional MR apparatuses.

Also advantageous, in particular, is the fact that MR apparatuses having only one transmit channel can also be operated with the transmit unit of the high-frequency system in accordance with the invention. To this end, one single input signal of the transmit unit can be distributed uniformly over the inputs of all high-frequency amplifiers by means of the first multiplexer/distributor network. The output signals of the high-frequency amplifiers are then added, by means of the second multiplexer/distributor network, to yield one single output signal with maximum power. The transmit unit of the high-frequency system in accordance with the invention may thus be operated in precisely the same manner as a conventional MR transmitting amplifier. In order to supply a plurality of transmit channels, however, a number of input signals corresponding to the number of transmit channels may also be amplified individually and independently of one another using the same transmit unit.

The transmit unit of the high-frequency system in accordance with the invention is expediently equipped with a control unit for activating the multiplexer/distributor network. By means of this control unit, assigned to the transmit unit, the control signals, which are preselected by a central control unit of the MR apparatus, may be converted to activate the multiplexer/distributor network. In principle, the control unit assigned to the transmit unit processes two separate distribution matrices, by means of which, on the one hand, the distribution of the input signals over the inputs of the high-frequency amplifiers, and, on the other, the distribution of the output signals of the high-frequency amplifiers over the transmit channels are preselected.

It is especially appropriate if the gain factors of the individual high-frequency amplifiers of the transmit unit can be controlled via the control unit. To this end, it is, for instance, possible for the switching components of the individual high-frequency amplifiers to be connected directly to the control unit for controlling the gain factors. Alternatively, the gain factors may also be controlled by the control unit by means of the multiplexer/distributor networks, which may, for this purpose, be equipped with e.g. suitable electronically controllable attenuator elements.

In order to be able to define with precision the high-frequency field distribution in the examination volume by means of the high-frequency system in accordance with the invention, it is expedient if the control unit is connected to measurement sensors, which serve for determining the high-frequency field strength generated by means of the individual resonator elements. By means of the control unit assigned to the transmit unit, a plurality of parallel, control loops is thereby realized, wherein the control variables are the high-frequency field strengths generated by means of the resonator elements. The measurement sensors supply the actual values, wherein, depending on the application, the desired values for the high-frequency field strengths are preselected by a central control unit of the MR apparatus. The gain factors of the high-frequency amplifiers of the transmit unit are then varied by the control unit as manipulated variables in accordance with the signals picked up by means of the measurement sensors.

The high-frequency system in accordance with the invention is expediently equipped with a plurality of controllable high-frequency signal generators for generating the low-power transmit signals. As a result of the plurality of controllable high-frequency signal generators, independent input signals can be generated for the transmit unit. For the full control of the high-frequency field distribution in the examination volume of the MR apparatus, the amplitudes and phases, as well as the transmit waveforms of the high-frequency signals supplied to the resonator elements via the transmit channels, should be individually preselectable by means of the controllable high-frequency signal generators.

An advantageous development of the high-frequency system in accordance with the invention comprises a receive unit with a plurality of receive channels assigned to the resonator elements. The opportunity thereby exists, on the one hand, to undertake a volume image generation with spatially homogeneous sensitivity profile by combining the MR signals detected by the individual resonator elements. Alternatively, partial images may be generated from the separately detected MR signals, which partial images are subsequently combined to form a complete image. On the one hand, this may be advantageous for improving the signal-to-noise ratio, wherein the individual resonator elements are used as SYNERGY coils. The opportunity also exists to combine the individual images with one another on the basis of the spatial sensitivity profiles assigned to the individual resonator elements, in order to save measurement time during image generation (the so-called SENSE method).

In order to protect the high-frequency amplifiers and, if applicable, the multiplexer/distributor networks, isolators should be provided in the high-frequency system in accordance with the invention, these being connected between the outputs of the high-frequency amplifiers and the corresponding inputs of the second controllable multiplexer/distributor network and/or between the outputs of the second controllable multiplexer/distributor network and the corresponding resonator elements of the high-frequency coil arrangement. Examples of non-reciprocal components that may be considered suitable for this purpose are commercially available circulators.

The high-frequency system in accordance with the invention is suitable for generating high-frequency fields in the examination volume and for acquiring MR signals from the examination volume in the case of an MR apparatus equipped with a main field coil for generating a homogeneous, static magnetic field in an examination volume, a number of gradient coils for generating magnetic field gradients in the examination volume, a central control unit for activating the gradient coils and the high-frequency system, and a reconstruction and visualization unit for processing and displaying the MR signals.

Advantages of the present application will be apparent to those of ordinary skill in the art upon reading and understanding the following detailed description.

BRIEF DESCRIPTION OF THE DRAWINGS

The invention will be further described with reference to an example of an embodiment shown in the drawing, to which, however, the invention is not restricted.

The FIGURE is a diagrammatic illustration of an exemplary magnetic resonance system.

DETAILED DESCRIPTION

Figure 1:
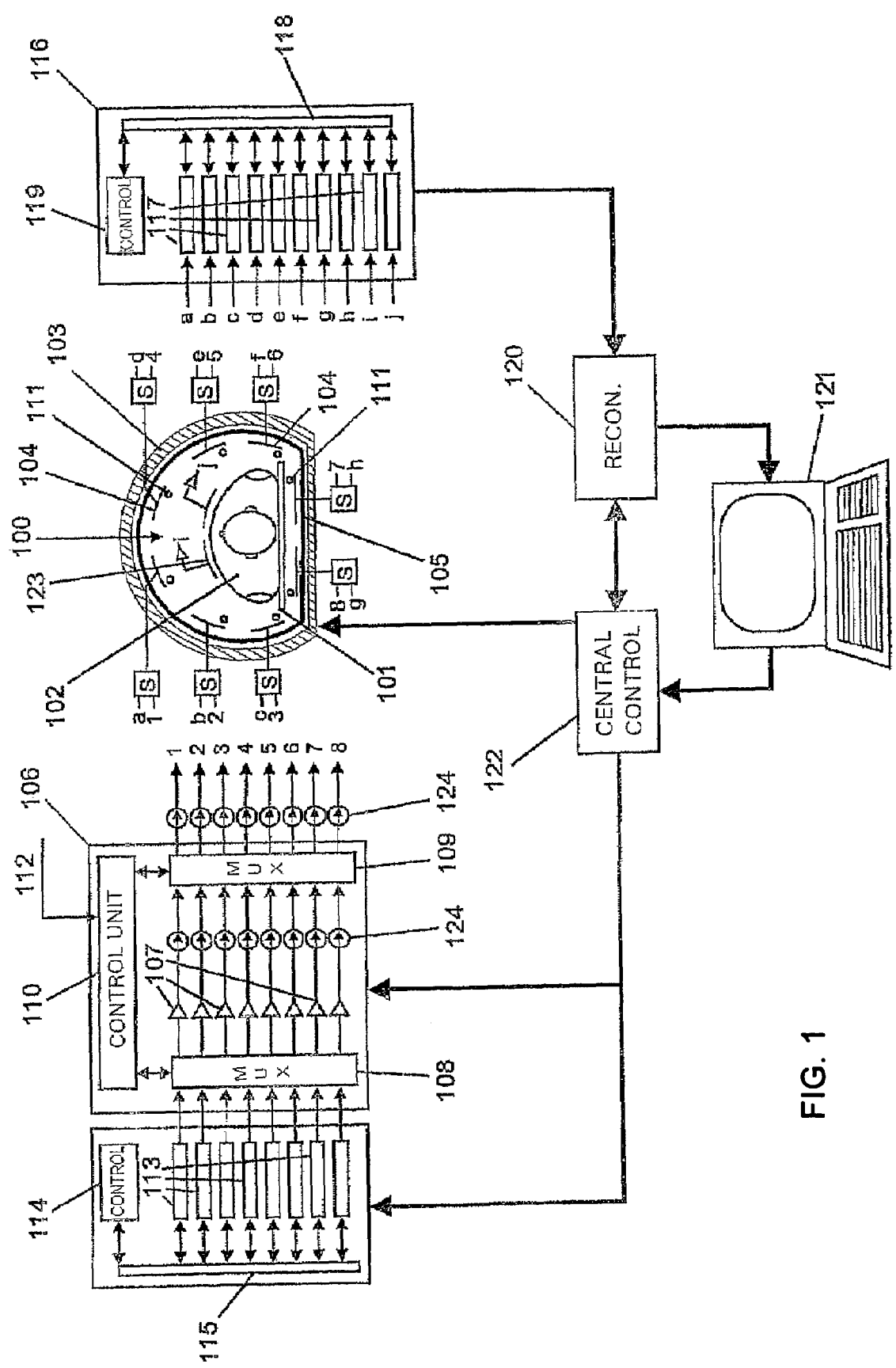

In the center of the MR apparatus shown in the drawing is an examination volume 100, in which a patient 102 is located on a patient table 101. In the area of the examination volume 100, a static and essentially homogeneous magnetic field with a strength of e.g. 1.5 tesla is generated by means of a main field magnet, which is not shown. As described above, time-variable magnetic-field gradients also have to be generated in examination volume 100 for the MR image generation. A plurality of gradient coils accommodated in a gradient tube 103 enclosing the examination volume 100 are used for this purpose. The gradient tube 103 shown has an asymmetrical cross-section, which is beneficial e.g. for achieving the greatest possible gradient field strengths. The generation of high-frequency fields, also necessary for the MR image generation, takes place by means of resonator elements 104, which are arranged around the examination volume 100 within the gradient tube 103 and which comprise conductor elements running parallel with the longitudinal axis of the main field magnet. The conductor elements are interlinked with each other and, if applicable, also in relation to ground, via capacitors, as a result of which the resonance characteristic of the arrangement is determined. The resonator elements 104 form the high-frequency coil arrangement of the MR apparatus shown in the drawing, which, in addition to exciting MR signals in the examination volume 100, is also used for their detection. Between the gradient tube 103 and resonator elements 104 of the coil arrangement is located an HF screen 105, which encloses the entire examination volume 100. By means of this, interference signals are kept out of the environment of the MR apparatus, and, in addition, the high-frequency emission into the environment is suppressed. Each of the eight resonator elements 104 shown in the drawing is connected to a changeover switch S, by means of which, depending on the operating mode, the resonator element 104 concerned is connected to one of two possible terminals. The terminals intended for the transmit mode are designated by numbers 1 to 8, and those for receive mode by lower-case letters a to h. The outputs of a transmit unit 106 provided with corresponding numbers are assigned to terminals 1 to 8. One transmit channel of the transmit unit 106 is assigned to each of the resonator elements 104. The transmit unit 106 is equipped with a plurality of high-frequency amplifiers 107, the inputs of which receive low-power transmit signals via a first controllable multiplexer/distributor network 108. The output signals of the high-frequency amplifiers 107 are distributed over the transmit channels 1 to 8 via a second controllable multiplexer/distributor network 109. To activate the multiplexer/distributor networks 108 and 109, the transmit unit 106 is equipped with a control unit 110. The gain factors of the high-frequency amplifiers 107 are individually controllable by means of the control unit 110. To protect the components contained in the transmit unit 106, a plurality of isolators (circulators) 124 are provided both upstream and downstream of the second multiplexer/distributor network 109. Arranged in the examination volume 100 as measurement sensors are pick-up coils 111, the measurement signals 112 of which are supplied to the control unit 110 in order that the high-frequency field distribution can be precisely regulated in the examination volume 100. To generate the high-frequency input signals for the transmit unit 106, a plurality of controllable high-frequency signal generators 113 are provided, by means of which the amplitudes and phases of the high-frequency signals supplied to the resonator elements 104 via the transmit channels 1 to 8 of the transmit unit 106 can be individually preselected. Serving to activate the high-frequency signal generators 113 is a control unit 114, which is connected to the high-frequency signal generators 113 via a digital databus 115. The preselection of the waveforms, the frequencies, the amplitudes and the phases of the low-power transmit signals generated by means of the high-frequency signal generators 113 takes place by means of the control unit 114. In addition, the time sequence of the signals to be supplied to the individual resonator elements 104 of the high-frequency coil arrangement is controlled by the control unit 114. Assigned to the terminals a to h intended for receive mode are receive channels of a receive unit 116, designated by the corresponding letters. Each receive channel a to h is equipped with a sensitive preamplifier/demodulator module 117. The NMR signals registered by the receive unit 116 are transmitted via a digital databus 118, firstly to a control unit 119 of the receive unit 116, and, from there, to a reconstruction unit 120, where the digital signals are combined with one another and Fourier-analyzed. The images generated by means of the reconstruction unit 120 are then output on a monitor of a microcomputer 121. The microcomputer 121 is simultaneously used for the control of the MR apparatus by a user, for which purpose the computer 121 is also connected to a central control unit 122. Activated by the central control unit 122 are the gradient coils, the transmit unit 106 and, via the control unit 114, the high-frequency signal generators 113. Surface coils 123 placed directly on the body of the patient 102, which are connected via the terminals i and j to the corresponding inputs of the receive unit 116, may also be used for the image generation. The surface coils 123 may be used e.g. for local cardiac image generation, wherein the conductor elements 104 of the coil arrangement arranged in the area of the back of the patient 102 (terminals g and h) are used together with the surface coils 123 in synergy operation for the data recording.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A high-frequency system for an MR apparatus with a high-frequency coil arrangement comprising a plurality of resonator elements, which coil arrangement is coupled to a transmit unit where a respective transmit channel of the transmit unit is assigned to the resonator elements, wherein the transmit unit comprises a plurality of high-frequency amplifiers, the inputs of which receive low-power transmit signals via a first controllable distributor network, in which the output signals of the high-frequency amplifiers are distributed over the transmit channels via a second controllable distributor network to generate a plurality of individually amplitude adjusted RF signals that are applied to the resonator elements.

2. A high-frequency system as claimed in claim 1, wherein a control unit is assigned to the transmit unit for activating the multiplexer/distributor networks.

3. A high-frequency system as claimed in claim 2, wherein the gain factor of each high-frequency amplifier of the transmit unit is controlled via the control unit.

4. A high-frequency system as claimed in claim 3, wherein measurement sensors, coupled to the control unit, serve for determining the high-frequency field strength generated by means of the individual resonator elements.

5. A high-frequency system as claimed in claim 1, having a plurality of controllable high-frequency signal generators for generating the low-power transmit signals.

6. A high-frequency system as claimed in claim 1, wherein the amplitudes and phases of the high-frequency signals supplied to the resonator elements via the transmit channels are individually preselectable.

7. A high-frequency system as claimed in claim 1, having a receive unit with a plurality of receive channels assigned to the respective resonator elements.

8. The high frequency system as set forth in claim 7 further including an array of transmit/receive switches which, in a transmit mode, connect the channels of the transmit unit with the resonator elements and, in a receive mode, connect the channels of the receive unit with the resonator elements.

9. A high-frequency system as claimed in claim 1, having isolators, these being connected between the outputs of the high-frequency amplifiers and the corresponding inputs of the second controllable multiplexer/distributor network and/or between the outputs of the second controllable multiplexer/distributor network and the corresponding resonator elements of the high-frequency coil arrangement.

10. An MR apparatus with a main field coil for generating a homogeneous, static magnetic field in an examination volume, a number of gradient coils for generating magnetic field gradients in the examination volume, a high-frequency system for generating high-frequency fields in the examination volume and for acquiring MR signals from the examination volume, and with a central control unit for activating the gradient coils and the high-frequency system, and a reconstruction and display unit for processing and displaying the MR signals, wherein the design of the high-frequency system is as claimed in claim 1.

11. A magnetic resonance system comprising:

a plurality of resonator elements disposed adjacent an examination volume;

a transmit unit for applying a plurality of RF signals of individually adjustable amplitude to each of the resonator elements, the transmit unit including:

a plurality of power amplifiers, a first, controllable distribution network connected with inputs of the power amplifiers which controllably distributes simultaneously one or more lower power RF input signals among the plurality of power amplifiers, and a second, controllable distribution network connected with outputs of the plurality of power amplifiers and with the plurality of resonator elements which controllably distributes output signals from the plurality of amplifiers over a plurality of transmit unit outputs to generate the plurality of individually amplitude adjusted RF signals that are applied to the resonator elements, the relative amplitude of each of the individually amplitude adjusted RF signals being adjusted by the first and second distribution networks.

12. The magnetic resonance system as claimed in claim 11, further including:

a plurality of receive channels;

a plurality of transmit/receive switches for selectively interconnecting the resonator elements with the transmit unit and the receive channels.

13. The magnetic resonance system as claimed in claim 11, further including:

a control network for controlling the first and second controllable distribution networks to control relative amplitudes of RF signals supplied to each of the resonator elements.

14. The magnetic resonance system as claimed in claim 13, wherein the control unit further controls a gain of each of the power amplifiers.

15. A magnetic resonance system including:

a plurality of resonator elements disposed adjacent an examination volume;

a transmit unit for applying a plurality of RF signals of individually adjustable amplitude to each of the resonator elements the transmit unit including:

a plurality of power amplifiers, a first, controllable distribution network which controllably distributes simultaneously one or more lower power RF input signals among the plurality of power amplifiers, and a second, controllable distribution network which controllably distributes output signals from the plurality of amplifiers over a plurality of transmit unit outputs to generate the plurality of individually amplitude adjusted RF signals that are applied to the resonator elements;

a control unit for controlling the first and second controllable distribution networks; and, a plurality of sensors disposed adjacent the examination region to sense RF signals in the examination region and provide feedback information to the control unit for adjusting the first and second distribution networks.

16. The magnetic resonance system as claimed in claim 15, further including:

a plurality of high frequency signal generators for supplying high frequency signals to the first distribution network to be distributed among the plurality of power amplifiers.

17. The magnetic resonance system as claimed in claim 16 wherein the high frequency generators control at least phases of the signals supplied to each resonator element.

18. A magnetic resonance method comprising:
distributing a plurality of low power RF signals among inputs to a plurality of power amplifiers;
controllably distributing individually amplitude adjusted outputs from the plurality of power amplifiers among a plurality of RF channels;
during a transmit mode, connecting the outputs from the plurality of RF channels to a plurality of resonator elements to excite resonance in a subject adjacent the resonator elements.

19. The method as claimed in claim 18 further including:
during a receive mode, connecting the plurality of resonator elements with a plurality of receiver channels;
reconstructing signals from the receive channels into a diagnostic image.

* * * * *